(12) United States Patent
Schleuning et al.

(10) Patent No.: US 7,502,398 B2
(45) Date of Patent: Mar. 10, 2009

(54) THERMALLY TUNED DIODE-LASER BAR PACKAGE

(75) Inventors: David Schleuning, Oakland, CA (US); C. David Nabors, Sunnyvale, CA (US); R. Russel Austin, Cool, CA (US)

(73) Assignee: Coherent, Inc., Santa Clara, CA (US)

( * ) Notice: Subject to any disclaimer, the term of this patent is extended or adjusted under 35 U.S.C. 154(b) by 14 days.

(21) Appl. No.: 11/591,716

(22) Filed: Nov. 2, 2006

(65) Prior Publication Data

US 2008/0123705 A1 May 29, 2008

(51) Int. Cl.
*H01S 3/04* (2006.01)
(52) U.S. Cl. .............................. 372/36; 372/34; 257/720
(58) Field of Classification Search ................... 372/36, 372/34; 257/720
See application file for complete search history.

(56) References Cited

U.S. PATENT DOCUMENTS

| 3,878,556 A | * | 4/1975 | Nyul | ............................ 372/36 |
| 5,105,429 A | | 4/1992 | Mundinger et al. | ............ 372/34 |
| 5,105,430 A | | 4/1992 | Mundinger et al. | ............ 372/35 |
| 5,394,426 A | | 2/1995 | Joslin | ....................... 372/50.12 |
| 2003/0128543 A1 | * | 7/2003 | Rekow | ........................ 362/259 |

FOREIGN PATENT DOCUMENTS

JP           2001-15660           1/2001

* cited by examiner

*Primary Examiner*—Minsun Harvey
*Assistant Examiner*—Michael Carter
(74) *Attorney, Agent, or Firm*—Stallman & Pollock LLP

(57) ABSTRACT

A directly cooled diode-laser bar package includes a diode-laser bar bonded to a heat-sink. The operating temperature of the diode-laser bar can be selectively varied by varying the thermal impedance of the heat-sink in or near a region of the heat-sink on which the diode-laser bar is bonded. The thermal impedance is selectively varied by varying the insertion depth of screws inserted into corresponding screw holes extending into the heat-sink close to or immediately adjacent the region on which the diode-laser bar is bonded.

16 Claims, 4 Drawing Sheets

THERMALLY TUNED DIODE-LASER BAR PACKAGE

TECHNICAL FIELD OF THE INVENTION

The present invention relates in general to linear diode-laser arrays. The invention relates in general to adjusting the output wavelength of a diode-laser bar that is thermally coupled to a heat-sink.

DISCUSSION OF BACKGROUND ART

A linear array of diode-lasers (edge-emitting semiconductor lasers) bar usually includes a plurality of individual diode-lasers (emitters) distributed along a substrate or "bar" comprising a plurality of semiconductor layers epitaxially grown on an electrically conductive semiconductor substrate. This type of array is usually termed a "diode-laser bar" by practitioners of the art. Such a bar usually has a length of about 10 millimeters (mm), a width of between about 1 mm and 1.5 mm, and a thickness of between about 100 micrometers (μm) and 300 μm. The emitters (diode-lasers) of the bar are formed in the epitaxial layers.

In a diode-laser bar configured to deliver near infrared radiation with a power of about 1 Watt (W) per emitter or more, the width of the emitters is typically between about 50 μm and 200 μm. Usually, the wider the emitter the higher the power output of an individual emitter. The number of emitters in a bar is determined by the length of the bar, the width of the emitters, and the spacing therebetween. Twenty emitters per bar is not an uncommon number of emitters per bar.

A diode-laser bar is usually packaged by bonding the bar in thermal contact with a heat-sink. A common application of a diode-laser bar is to provide optical pump-radiation for a energizing a solid-state laser gain-medium. The wavelength of light (radiation) emitted by the bar is usually required to correspond with a particular absorption peak of the gain medium. By way of example, neodymium-doped yttrium orthovanadate (Nd:YVO$_4$), which is commonly used as a gain-medium in solid-state lasers having an output wavelength of 1064 nanometers (nm), has an absorption peak at 808 nm. This absorption peak has a FWHM bandwidth less than 2.0 nm. Ideally, the diode-laser bar output in steady state operation should have a peak wavelength equal to the absorption peak wavelength and a comparable FWHM bandwidth.

The growth process for diode-lasers in a bar is such that it is difficult to produce a batch of diode-laser bars each having exactly the same emitting wavelength, let alone a particular emitting wavelength. Usually such a batch of bars must be sorted to isolate those bars that have the desired emitting wavelength. Further, in any bar having nominally a desired emitting wavelength there may be a distribution of individual emitter wavelengths about that nominal emitting wavelength. The wider this distribution, the wider will be the FWHM bandwidth of the combined output of the emitters. There is a need for a passive tuning method for diode-laser bars that will at least allow minor adjustments to be made to the combined emitting wavelength for improving batch yield. Preferably, the tuning method should allow for differentially tuning emitters in a bar to narrow (or broaden) the combined emitting bandwidth of the bar.

SUMMARY OF THE INVENTION

The present invention is directed to a method and apparatus for thermally tuning a diode-laser bar. In one aspect of the present invention a method in accordance with the present invention includes placing the diode-laser bar in thermal contact with a heat-sink and selectively varying the thermal impedance of the heat-sink for heat generated by the diode-laser bar.

Selectively varying the thermal impedance of the heat-sink for heat generated by the diode-laser bar selectively varies the steady-state temperature of the diode-laser bar when the diode-laser is operating. Varying the temperature of the diode-laser bar varies the emitting wavelength of emitters of the diode-laser bar. In a preferred embodiment of the method, the thermal impedance of the heat-sink is varied differently at two or more different positions in the heat-sink adjacent a region in which the heat-sink is in thermal contact with the diode-laser bar. This allows emitters in the bar to be differentially tuned.

In another aspect of the present invention a diode-laser bar package comprises a heat-sink having a diode-laser bar located thereon in thermal communication therewith on a region thereof. The heat-sink has a selectively mechanically variable thermal impedance for heat generated by operation of the diode-laser bar.

In a preferred embodiment of the inventive diode-laser bar, the selective mechanical variation of thermal impedance is provided by a plurality of screw holes extending into the heat-sink, having screws extending therein. Screwing the screws into or out of the holes changes the insertion distance thereof. Different insertion distances provide correspondingly different thermal impedances of the heat-sink for heat generated by the diode-laser bar. This provides for different operating temperatures of the diode-laser bar and accordingly different emitting wavelengths. Differential tuning of emitters of the diode-laser bar can be accomplished by different insertion distances for two or more temperature-adjusting screws.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
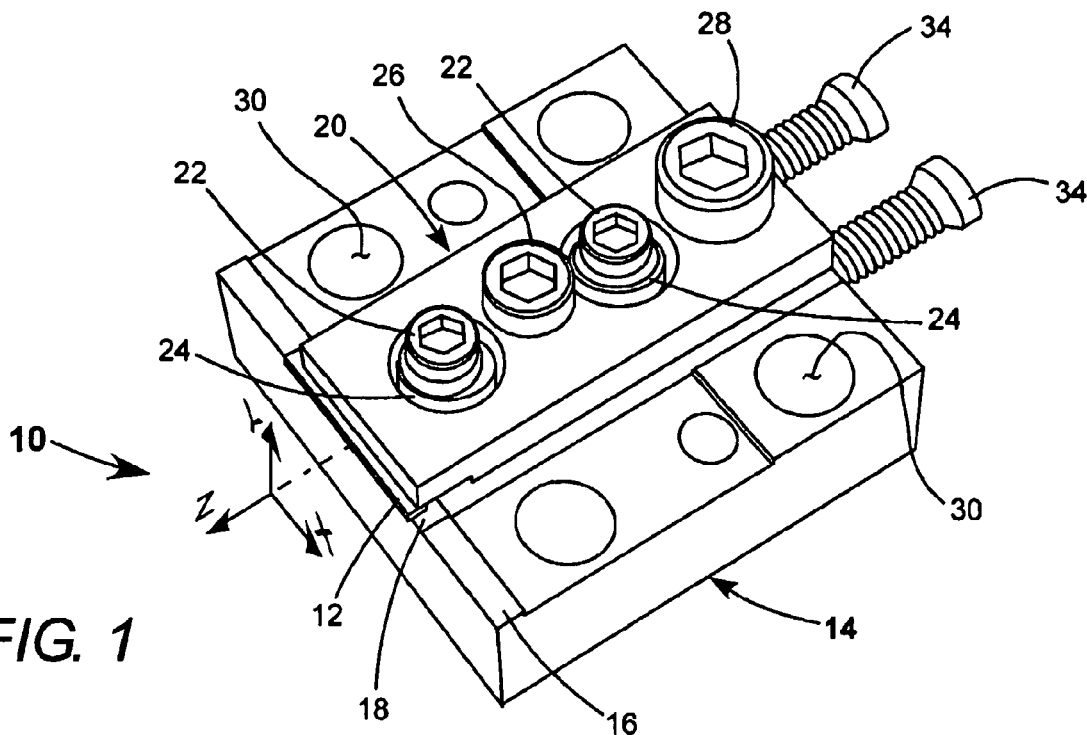
FIG. 1 is a three dimensional view schematically illustrating a preferred embodiment of a thermally tunable diode-laser bar package in accordance with the present invention, including a diode-laser bar bonded in thermal contact with a heat-sink, and with the heat-sink having two temperature-adjusting screws extending horizontally through the heat-sink in a direction perpendicular to the length of the diode-laser bar, the extent of the penetration of the screws into the heat-sink being adjustable for adjusting the thermal impedance of the heat-sink.

Referring now to the drawings, wherein like components are designated by like reference numerals, FIG. 1 schematically illustrates a preferred embodiment 10 of a thermally tunable diode-laser bar package in accordance with the present invention. Package 10 includes a diode-laser bar 12 bonded, epitaxial layers down, in electrical and thermal contact with a raised edge-portion 16 of a rectangular copper heat-sink 14. The bar is preferably bonded using a solder layer 18. However, other methods of providing an electrical and thermal contact bond are not precluded. By way of example, a conductive epoxy could be substituted for solder, or the bond made by direct ("optical") contact.

A cathode plate 20 is clamped to heat-sink 14 by screws 22 extending through dielectric bushings 24 configured such that the cathode plate is electrically insulated from the heat-sink. Cathode plate 20 is connected to an upper surface (the substrate side or n-side) of diode-laser bar 12 by a connecting foil (not shown). The connecting foil is not depicted in FIG. 1, as the scale of the drawing is insufficient for accurate depiction of the foil. Details of this foil connection are not necessary for understanding principles of the present invention. A screw 28 provides for connecting the cathode plate via an electrical lead to a negative terminal of a suitable power supply (not shown). Connection of the positive terminal of the power supply is made, via a suitable electrical lead, directly to the heat-sink.

A shorting-screw 26 is provided for electrically connecting the cathode plate to the heat-sink during transport of the package or during periods of extended non-use. Screw 26 must, of course be removed in order to operate the package. Four apertures 30 extending vertically through the heat-sink provide means for attaching package 10 to a suitable base (not shown). The term "vertically" is used here merely for convenience of description and should not be construed as limiting the package to use in the orientation depicted in FIG. 1.

A key principle of the present invention is to provide heat-sink 14 with a selectively variable thermal-impedance for heat generated by the diode-laser bar. Heat is generated at a p-i-n junction formed in the epitaxial layers of the diode-laser bar by the passage of electric current through the bar. The temperature at which the diode-bar operates is determined, inter alia, by the magnitude of this heat and the thermal impedance of the heat-sink to this heat. The emitting wavelength of a GaAs based diode-laser bar is "tunable" by about 0.3 nanometers (nm) per degree Celsius (nm/° C.). Providing a selectively variable thermal impedance for heat generated by operation of the diode-laser bar provides a means of selectively varying the operating temperature and consequently the emitting-wavelength of the diode-laser bar.

A laser includes a number of individual lasers (emitters) that are parallel to each other. Due to the thermal crowding of these emitters, centrally located emitters will be hotter and therefore have longer wavelength than emitters at the ends of the diode-laser bar. Typically, the spectrum of the laser bar considers the ensemble of all the emitters and thus the width of the spectrum can be a result of hot emitters in the center and cooler emitters on the edge. By providing a heat-sink with a lower thermal impedance for heat adjacent the center emitters than adjacent the end emitters it is possible to more closely match the emitting wavelength of all of the emitters and thereby narrow the overall "bar" spectrum. This is of particular importance for optically pumping solid-state gain media having narrow absorption peaks.

Figure 2:
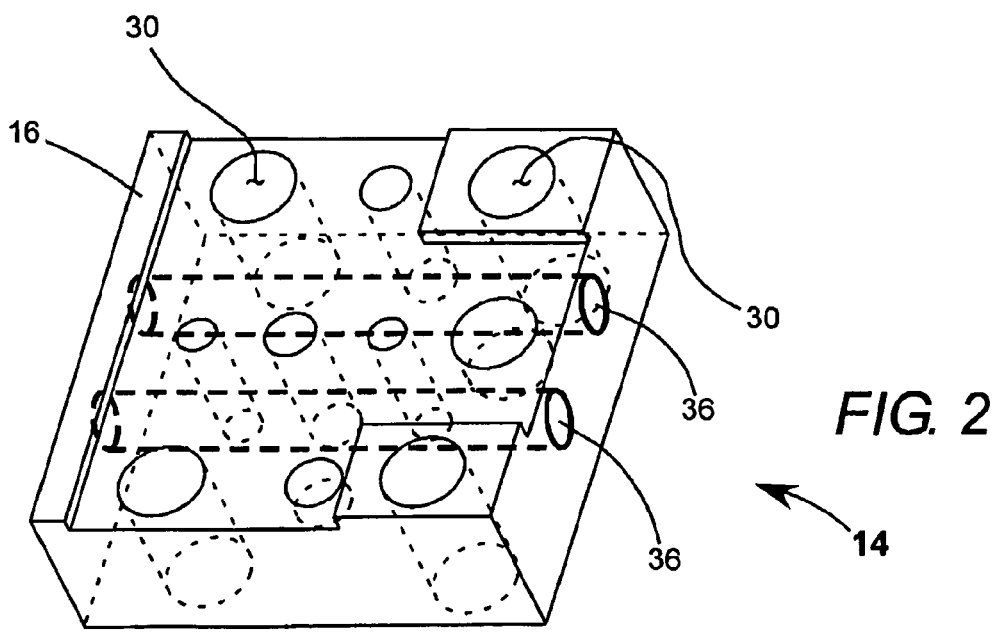
FIG. 2 is a transparent three dimensional view schematically illustrating details of screw-holes extending horizontally through the heat-sink in a direction perpendicular to the length of the diode-laser bar for receiving the temperature-adjusting screws of FIG. 1.

Continuing with reference to FIG. 1 and with reference in addition to FIG. 2, selectively variable thermal impedance for heat-sink 14 is provided by two screws 34 extending into corresponding screw-holes 36 extending horizontally through the heat-sink in a direction perpendicular to the length direction of the diode-laser bar bonded thereon (see FIG. 2). Again the term "horizontally" is used here merely for convenience of illustration and should not be construed as meaning that package 10 must be operated in any particular orientation. This "horizontal" direction is parallel to the p-i-n junction plane of the diode-laser bar (the X-Z plane in the X, Y, Z Cartesian axis system of FIG. 1), here parallel to the surface of the heat-sink on which the diode-laser bar is bonded.

In the example of FIGS. 1 and 2, screw-holes 36 are "blind" holes extending under raised edge 16 of the heat-sink on which diode-laser bar 12 is bonded. Holes 36 may extend completely through the heat-sink. Preferably the screw-holes should extend into the region of the heat-sink adjacent to, and, more preferably, immediately below the diode-laser bar. In this example also, the screw-holes are symmetrically disposed with respect to the diode-laser bar, and extend under the diode-laser bar at opposite ends thereof, but this should not be construed as limiting the present invention to that disposition of the screw-holes. Similarly, there could be only one screw in one hole, or more than two screws extending through more than two holes, the extent to which this is possible depending, inter alia, on the location of other holes in the heat-sink provided for (fixed) fixing or clamping screws.

The screw holes increase the thermal impedance of the heat sink. Inserting the screws into the heat sink reduces the thermal impedance back towards what it would have been if the holes were not present.

Figure 3:
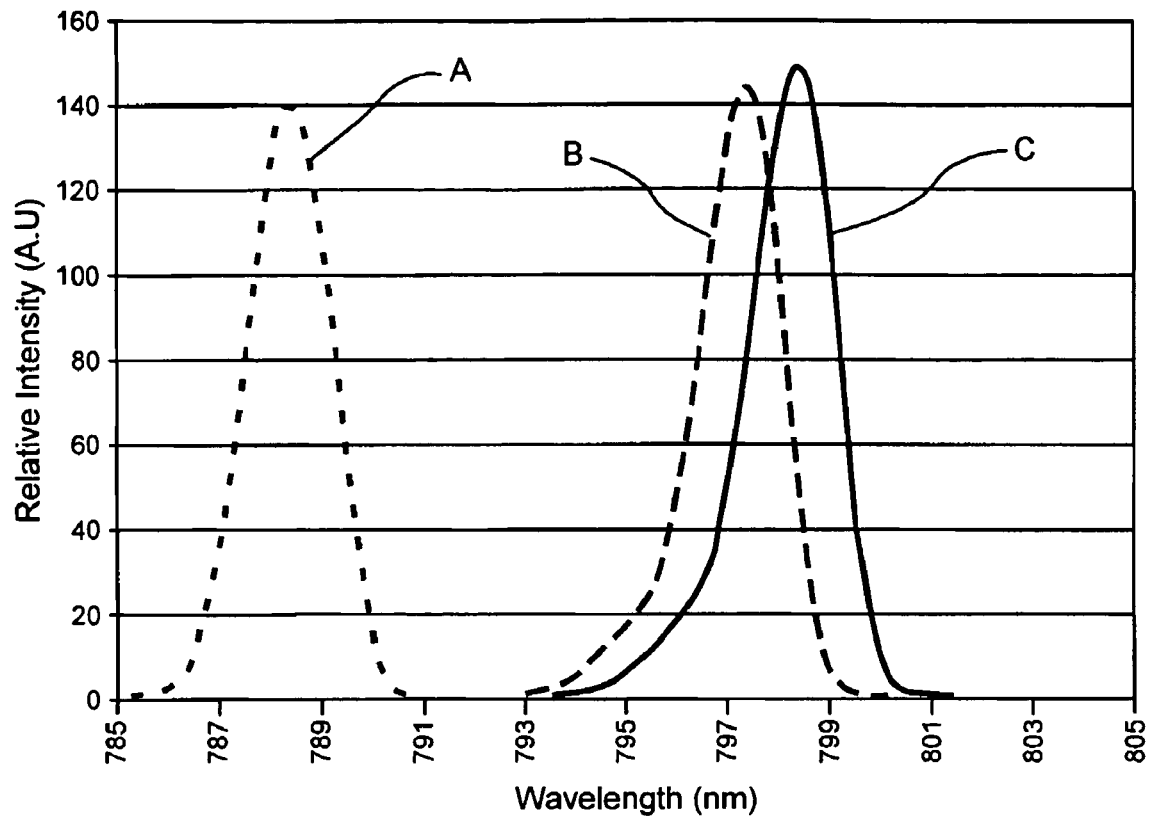
FIG. 3 is a graph schematically illustrating measured combined output power as a function of wavelength for one example of the diode-laser bar package of FIG. 1, in pulsed operation, and in CW operation with different penetrations of the temperature-adjusting screws into the screw-holes.

FIG. 3 is a graph schematically illustrating measured combined output power as a function of wavelength for one example of the diode-laser bar package of FIG. 1, in pulsed operation (curve A), and in CW operation with screws 34 completely inserted (curve B) and completely withdrawn (curve C) from screw holes 36. In this example the diode-laser bar included 49 emitters in a 50% fill factor with total output power of 60 W. Heat-sink 14 was a copper block having a length (in the direction of the diode-laser bar length) of 25 millimeters (mm) a width of 25 mm and height (thickness) of about 8 mm. Screw-holes 36 had a diameter of 2.3 mm with hole-centers 2.5 mm below the upper surface of the heat-sink and extended to within 0.8 mm of the front face of the heat-sink. Screws 34 were copper 4-40 screws.

In pulsed operation, the duty cycle of pulsing (1%) was sufficient that no significant heating of the diode-laser bar was present. Curve B (screws 34 completely inserted) indicates a junction temperature of the diode-laser bar of about 56° C. Curve C (screws 34 completely withdrawn) indicates a junction temperature of the diode-laser bar of about 63° C. The asymmetry in curves B and C is the result of different emitters in the diode-laser bar emitting at different wavelengths with different powers. It is possible that this could be corrected at least partially by making the insertion distance for one screw different from that of the other and thereby differently tuning emitters of the diode-laser bar.

Figure 4:
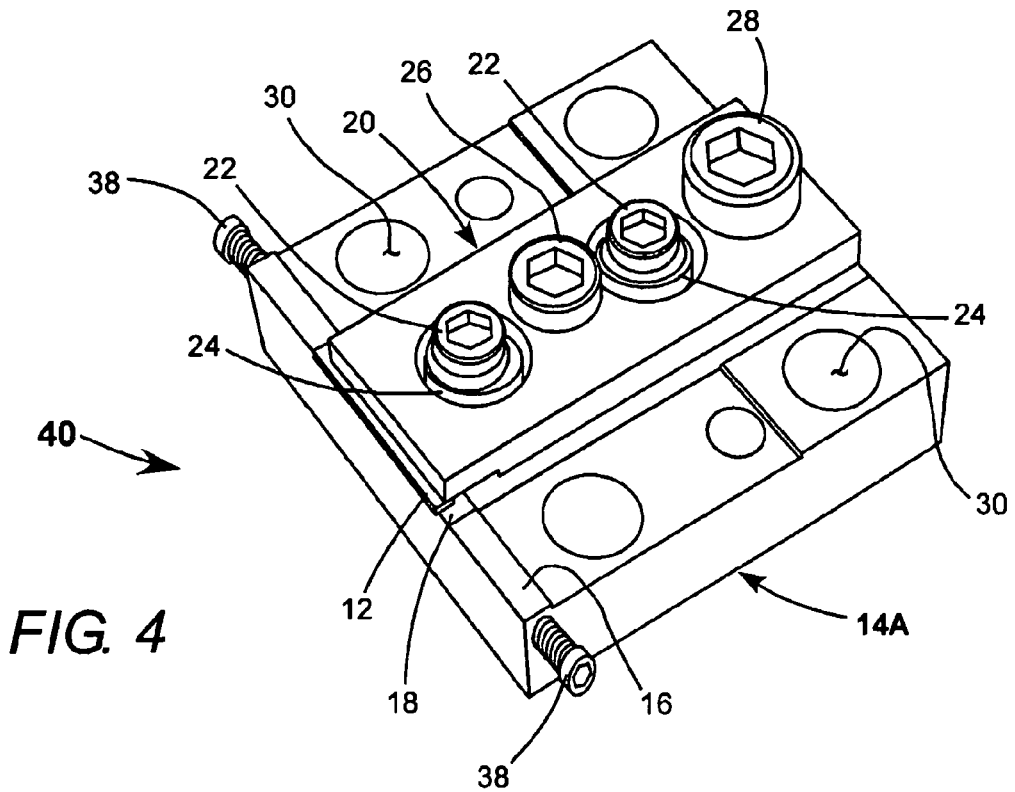
FIG. 4 is a three-dimensional view schematically illustrating another preferred embodiment of a thermally tunable diode-laser bar package in accordance with the present invention, similar to the embodiment of FIG. 1 but wherein the two temperature-adjusting screws extend horizontally into the heat-sink in opposite directions parallel to the length direction of the diode-laser bar.
Figure 5:
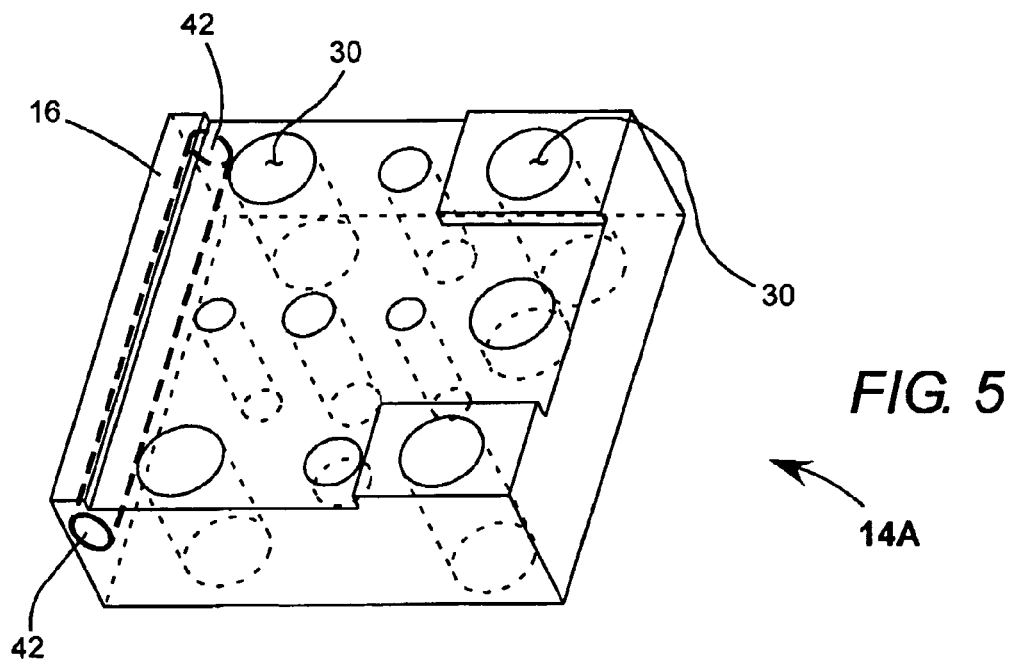
FIG. 5 is a transparent three-dimensional view schematically illustrating details of a single screw-hole extending horizontally completely through the heat-sink in a direction parallel to the length direction of the diode-laser bar for receiving the temperature-adjusting screws of FIG. 4 at each opposite ends of the screw-hole.

FIGS. 4 and 5 schematically illustrate another embodiment 40 of a diode-laser bar package in accordance with the present invention. Package 40 is similar in principle to package 10 of FIGS. 1 and 2. In package 40, however, temperature-adjusting screws 34 and screw holes 34 of package 10 are replaced by screws 38 extending horizontally into a heat-sink 14A from opposite sides of the heat-sink in opposite (opposing) directions parallel the length of the diode-laser bar. In the example illustrated the screws are inserted into opposite ends of a single screw-hole 40 extending completely through the heat-sink from one side to the other. It is also possible of course to drill one screw-hole from one side of the heat-sink and another screw-hole from the opposite side of the heat-sink. Screws can be adjusted in situ in some applications. By way of example, in optical pumping applications, side adjustment screws could provide easier access than the end adjustment screws of FIG. 1.

Figure 6:
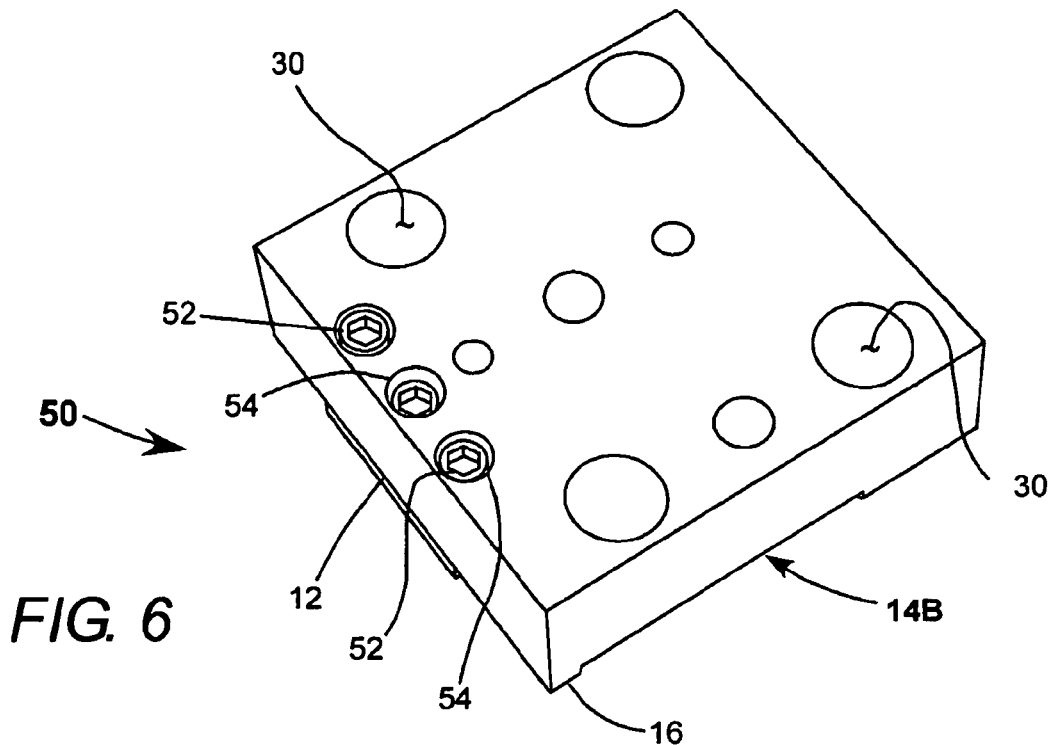
FIG. 6 is a three-dimensional view schematically illustrating another preferred embodiment of a thermally tunable diode-laser bar package in accordance with the present invention, seen from the base thereof, similar to the embodiment of FIG. 1 but wherein the three temperature-adjusting screws extend vertically into the heat-sink from the base thereof in a region thereof below the diode-laser bar in a direction perpendicular to the length direction of the diode-laser bar.
Figure 7:
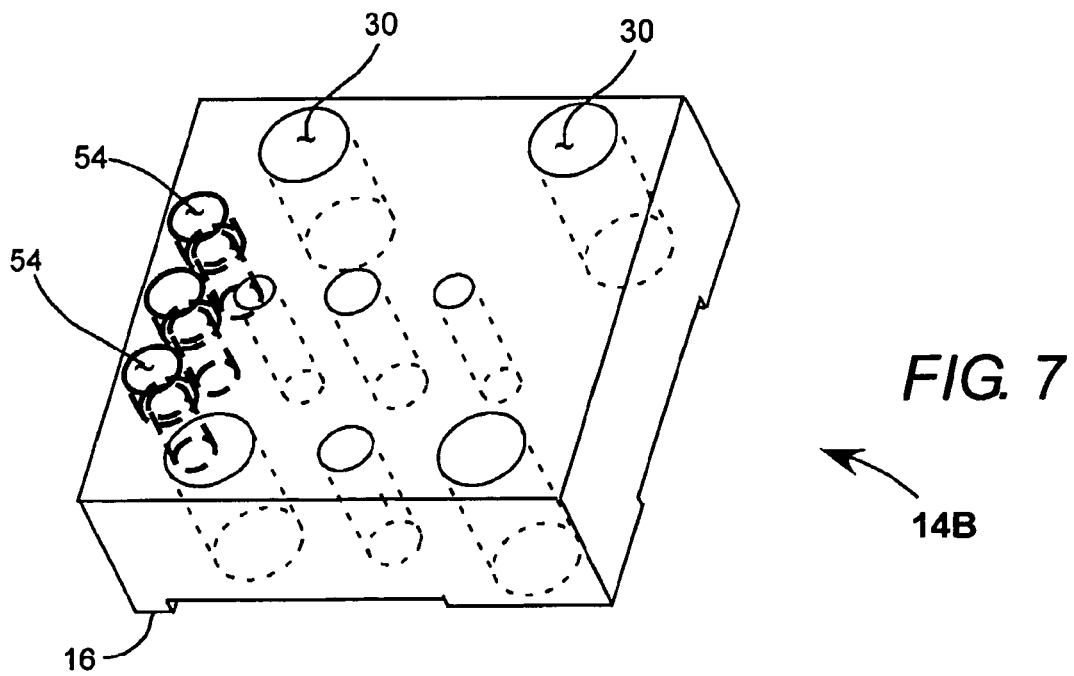
FIG. 7 is a transparent three-dimensional view schematically illustrating details of a three countersunk screw-holes extending vertically into the heat-sink in a direction perpendicular to the length direction of the diode-laser bar for receiving the temperature-adjusting screws of FIG. 6.

FIG. 6 and FIG. 7 schematically illustrate another embodiment 50 of a diode-laser bar package in accordance with the present invention. Package 50 is similar in principle to package 10 of FIGS. 1 and 2. In package 50, however, temperature-adjusting screws 34 and screw holes 34 of package 10 are replaced by three screws 52 extending vertically into a heat-sink 14B from the base of the heat-sink in a direction perpendicular to the length of the diode-laser bar and perpendicular to the junction plane of the diode-laser bar. Two of the screws are adjacent opposite ends and the third adjacent the center of the region with which the diode-laser bar is in thermal contact. In the example illustrated, countersunk screw holes 52 are provided for receiving the temperature-adjusting screws. This allows that any of the temperature-adjusting screws can be substantially withdrawn from the screw hole without the screw head protruding below the heat-sink and preventing the heat-sink from being clamped on a base. A particular advantage of this embodiment is that there can practically be four or more temperature-adjusting screws adjacent the diode-laser bar. This provides for flexibility in differential tuning of emitters for matching the wavelength of the emitters.

It should be noted that while the present invention is described above in terms of varying thermal impedance of heat-sink by screwing screws in and out of screw holes, the screw-holes may be replaced, in theory at least, by plain holes of any cross-section and the screws replaced by plugs of a matching cross-section. In such an arrangement the plugs would preferably have at least a running close fit and preferably a running tight fit in the holes. This could prevent difficulty in adjusting penetration distances of the plugs or in maintaining a plug at a selected penetration distance in a hole. Screws or plugs may also be of material different from that of the heat-sink. By way of example, in a copper heat-sink, a plug or screw may be made from stainless steel having a higher thermal impedance than that of copper, or in theory at least, made from diamond, having a lower thermal impedance than that of copper. Further, the diode-laser bar need not be in direct thermal communication with the heat-sink but in communication via a diamond heat spreader or the like.

In summary, the present invention is described above in terms of a preferred and other embodiments. The invention is not limited, however, to the embodiments described and depicted. Rather, the invention is limited only by the claims appended hereto.

What is claimed is:

1. Diode-laser apparatus comprising:
   a heat-sink;
   a diode-laser bar in thermal communication with the heat-sink on a region thereof;
   at least one hole having a length and extending into the heat-sink to a position therein adjacent the region thereof on which the diode-laser bar is in thermal communication; and
   at least one temperature-adjusting member partially inserted within the length of the hole and having a selectively variable insertion distance into the hole and wherein said member does not also function to connect the heat sink to another structure.

2. The apparatus of claim 1, wherein the diode-laser bar is bonded in thermal communication with the heat-sink via a solder layer.

3. The apparatus of claim 1, wherein the hole is a screw-hole and the temperature-adjusting member is a screw, the insertion distance of the screw being selectively variable by turning the screw.

4. The apparatus of claim 1, wherein the at least one hole extends into the heat-sink in a direction parallel to the junction plane of the diode-laser bar.

5. The apparatus of claim 4, wherein the at least one-hole extends into the heat-sink in a direction perpendicular to the length direction of the diode-laser bar.

6. The apparatus of claim 5, wherein there are first and second holes extending into the heat-sink terminating adjacent respectively first and second ends of the region thereof with which the diode-laser bar is in thermal communication.

7. The apparatus of claim 1, wherein the at least one-hole extends into the heat-sink in a direction parallel to the length direction of the diode-laser bar.

8. The apparatus of claim 7, wherein there is only one hole, and that hole extends completely through the heat-sink adjacent the region thereof with which the diode-laser bar is in thermal communication.

9. The apparatus of claim 1, wherein the at least one hole extends into the heat-sink in a direction perpendicular to the junction plane of the diode-laser bar.

10. The apparatus of claim 9, wherein there are first, second, and third holes extending into the heat-sink and terminating adjacent respectively first and second ends and the center of the region thereof with which the diode-laser bar is in thermal communication.

11. The apparatus of claim 1, wherein the temperature-adjusting members and the heat-sink are made from the same material.

12. The apparatus of claim 11, wherein the temperature-adjusting member is made from a material different from that of the heat sink.

13. The apparatus of claim 12, wherein the temperature-adjusting member has a lower thermal impedance than that of the heat-sink.

14. The apparatus of claim 12, wherein the temperature-adjusting member has a higher thermal impedance than that of the heat-sink.

15. Optical apparatus, comprising:

a heat-sink;

a diode-laser bar located on the heat sink in thermal communication therewith on a region thereof; and wherein the heat-sink has a selectively, mechanically variable thermal impedance for heat generated by operation of the diode-laser bar and wherein said heat-sink has at least one screw-hole having a length and extending therein to a position adjacent the region thereof on which the diode-laser bar is located, and at least one screw extending partially within the length of said at least one hole, and wherein the thermal impedance is selectively varied by selectively varying the extension of the screw into the hole and wherein said screw does not also function to connect the heat sink to another structure.

16. A laser system comprising:

an elongated diode laser bar having a plurality of emitters;

a metal heat sink, with said bar being mounted on said heat sink, said heat sink including at least one hollow bore having a length therein which increases the thermal impedance of the heat sink in the region of the bore; and a metal member partially received within the length of the hollow bore to a depth which is adjustable to control the thermal impedance of the heat sink and control the wavelength output of the emitters and wherein said member does not also function to connect the heat sink to another structure.

\* \* \* \* \*